United States Patent
Prautzsch

(10) Patent No.: US 9,318,406 B2
(45) Date of Patent: Apr. 19, 2016

(54) DEVICE AND METHOD FOR DETERMINING THE TEMPERATURE OF A HEAT SINK

(75) Inventor: Harald Prautzsch, Ellwangen (DE)

(73) Assignee: SEW-EURODRIVE GMBH & CO. KG, Bruchsal (DE)

( * ) Notice: Subject to any disclaimer, the term of this patent is extended or adjusted under 35 U.S.C. 154(b) by 1140 days.

(21) Appl. No.: 11/887,082

(22) PCT Filed: Mar. 4, 2006

(86) PCT No.: PCT/EP2006/002006
§ 371 (c)(1),
(2), (4) Date: Sep. 25, 2007

(87) PCT Pub. No.: WO2006/099936
PCT Pub. Date: Sep. 28, 2006

(65) Prior Publication Data
US 2009/0024345 A1    Jan. 22, 2009

(30) Foreign Application Priority Data
Mar. 22, 2005 (DE) .......... 10 2005 013 762

(51) Int. Cl.
*H05K 1/02* (2006.01)
*H05K 7/00* (2006.01)
*H01L 23/34* (2006.01)
(Continued)

(52) U.S. Cl.
CPC .......... *H01L 23/34* (2013.01); *H01L 23/3735* (2013.01); *H01L 23/62* (2013.01); *H05K 1/0207* (2013.01); *H01L 23/4006* (2013.01); *H01L 2924/0002* (2013.01); *H05K 1/0206* (2013.01); *H05K 3/0061* (2013.01); *H05K 2201/09745* (2013.01); *H05K 2201/1056* (2013.01); *H05K 2201/10409* (2013.01)

(58) Field of Classification Search
CPC ......... G01K 7/01; G01K 17/00; G01K 17/06; G01N 25/18; G01N 30/66; G01N 2011/0093; H01L 21/67248; H01L 25/072; H05K 1/02; H05K 7/00
USPC ............. 374/1, 4–5, 29, 43–45, 57, 137, 141, 374/145, 165, 102, 100; 702/130–136, 99
See application file for complete search history.

(56) References Cited

U.S. PATENT DOCUMENTS 3,774,078 A * 11/1973 Martin .......................... 361/702
4,860,165 A * 8/1989 Cassinelli ............... H01L 23/36
                                                                165/80.4
(Continued)

FOREIGN PATENT DOCUMENTS

DE    692 09 772    11/1996
DE    198 07 718    9/1999
(Continued)

OTHER PUBLICATIONS

NN72043308: Fabricating Pinned Multilayer Boards. Apr. 1972. Abstract only.*
(Continued)

Primary Examiner — Gail Kaplan Verbitsky
(74) Attorney, Agent, or Firm — Kenyon & Kenyon LLP

(57) ABSTRACT

A method for determining the temperature of a heat source and an electronic unit, including a printed-circuit board equipped with a sensor and a heat sink, the sensor being connected to the heat sink in a heat-conducting manner.

21 Claims, 5 Drawing Sheets

(51) Int. Cl.
  *H01L 23/373* (2006.01)
  *H01L 23/62* (2006.01)
  *H01L 23/40* (2006.01)
  *H05K 3/00* (2006.01)

(56) References Cited

U.S. PATENT DOCUMENTS

| | | | | |
|---|---|---|---|---|
| 5,065,282 A | * | 11/1991 | Polonio | 361/752 |
| 5,158,912 A | * | 10/1992 | Kellerman | H01L 21/4867 257/706 |
| 5,200,657 A | * | 4/1993 | Prestel | 310/50 |
| 5,214,000 A | * | 5/1993 | Chazan et al. | 216/18 |
| 5,295,044 A | * | 3/1994 | Araki et al. | 361/709 |
| 5,311,398 A | | 5/1994 | Schirmer et al. | |
| 5,430,611 A | * | 7/1995 | Patel et al. | 361/705 |
| 5,477,409 A | * | 12/1995 | Sayka | H01L 23/34 257/E23.08 |
| 5,483,102 A | * | 1/1996 | Neal et al. | 257/712 |
| 5,499,444 A | * | 3/1996 | Doane et al. | 29/830 |
| 5,522,215 A | | 6/1996 | Matsunaga et al. | |
| 5,586,006 A | * | 12/1996 | Seyama et al. | 361/719 |
| 5,648,889 A | | 7/1997 | Bosli | |
| 5,713,030 A | * | 1/1998 | Evoy | 713/322 |
| 5,825,625 A | * | 10/1998 | Esterberg | H01L 23/3677 257/717 |
| 5,831,333 A | | 11/1998 | Malladi et al. | |
| 5,847,452 A | * | 12/1998 | Tantoush | H01L 23/4006 257/722 |
| 5,864,465 A | * | 1/1999 | Liu | G06F 1/206 174/16.3 |
| 5,867,809 A | * | 2/1999 | Soga et al. | 702/130 |
| 5,870,286 A | * | 2/1999 | Butterbaugh | H01L 23/4093 165/80.2 |
| 5,875,096 A | * | 2/1999 | Gates | H01L 23/10 165/80.3 |
| 5,891,528 A | * | 4/1999 | Turek et al. | 427/448 |
| 6,092,926 A | | 7/2000 | Still et al. | |
| 6,111,308 A | * | 8/2000 | Newman | 257/676 |
| 6,143,590 A | * | 11/2000 | Ohki et al. | 438/122 |
| 6,175,498 B1 | * | 1/2001 | Conroy et al. | 361/704 |
| 6,321,175 B1 | * | 11/2001 | Nagaraj | 702/132 |
| 6,323,549 B1 | * | 11/2001 | deRochemont et al. | 257/703 |
| 6,349,268 B1 | * | 2/2002 | Ketonen et al. | 702/130 |
| 6,507,102 B2 | * | 1/2003 | Juskey et al. | 257/706 |
| 6,663,278 B1 | * | 12/2003 | Chien et al. | 374/43 |
| 6,710,432 B1 | * | 3/2004 | Pasqualini | 257/676 |
| 6,748,350 B2 | * | 6/2004 | Rumer et al. | 703/9 |
| 6,768,061 B2 | * | 7/2004 | Kondo | 174/255 |
| 6,787,896 B1 | | 9/2004 | Petty-Weeks | |
| 6,842,714 B1 | * | 1/2005 | Acar et al. | 702/136 |
| 6,854,881 B2 | * | 2/2005 | Nada | 374/169 |
| 6,886,976 B2 | * | 5/2005 | Gaasch et al. | 374/5 |
| 7,251,138 B2 | * | 7/2007 | Hornung et al. | 361/704 |
| 7,347,621 B2 | * | 3/2008 | Sri-Jayantha et al. | 374/166 |
| 7,396,156 B2 | * | 7/2008 | Uraki | 374/44 |
| 7,595,998 B2 | * | 9/2009 | Tokunaga | 361/752 |
| 7,808,097 B2 | * | 10/2010 | Wang et al. | 257/701 |
| 8,035,121 B2 | * | 10/2011 | Park | 257/98 |
| 8,974,116 B2 | * | 3/2015 | Okamoto | G01K 1/14 361/690 |
| 2001/0048708 A1 | * | 12/2001 | Mikubo et al. | 374/43 |
| 2002/0005272 A1 | | 1/2002 | Hirano et al. | |
| 2002/0075024 A1 | * | 6/2002 | Fredeman et al. | 324/760 |
| 2002/0157067 A1 | * | 10/2002 | Yaguchi | 716/1 |
| 2002/0157821 A1 | | 10/2002 | Beitelmal et al. | |
| 2002/0163781 A1 | * | 11/2002 | Bartola et al. | 361/699 |
| 2003/0100197 A1 | * | 5/2003 | Veitschegger et al. | 439/55 |
| 2004/0052077 A1 | * | 3/2004 | Shih | 362/294 |
| 2004/0055152 A1 | * | 3/2004 | Fraivillig | H05K 3/0061 29/830 |
| 2004/0182564 A1 | * | 9/2004 | Tremmel | 165/247 |
| 2005/0109533 A1 | * | 5/2005 | Kurashina et al. | 174/255 |
| 2005/0114068 A1 | * | 5/2005 | Chey et al. | 702/130 |
| 2005/0242823 A1 | * | 11/2005 | Parker | 324/530 |
| 2005/0258446 A1 | * | 11/2005 | Raos et al. | 257/99 |
| 2006/0045165 A1 | * | 3/2006 | Chan et al. | 374/43 |
| 2006/0052970 A1 | * | 3/2006 | Arabi et al. | 702/132 |
| 2006/0200958 A1 | * | 9/2006 | deRochemont et al. | 29/25.41 |
| 2007/0170583 A1 | * | 7/2007 | Kwon et al. | 257/724 |
| 2008/0078572 A1 | * | 4/2008 | Watanabe et al. | 174/262 |
| 2008/0151515 A1 | * | 6/2008 | Das et al. | 361/761 |
| 2009/0057147 A1 | * | 3/2009 | Kayyem | 204/403.01 |
| 2010/0007403 A1 | * | 1/2010 | Ness et al. | 327/512 |
| 2011/0089529 A1 | * | 4/2011 | Fowlkes | H01L 23/3677 257/528 |
| 2014/0268577 A1 | * | 9/2014 | Swaminathan | H05K 1/0204 361/719 |

FOREIGN PATENT DOCUMENTS

| | | | |
|---|---|---|---|
| DE | 199 20 401 | | 11/1999 |
| EP | 0 654 176 | | 5/1995 |
| EP | 1 455 391 | | 9/2004 |
| EP | 1 498 947 | | 1/2005 |
| GB | 2 337 121 | | 11/1999 |
| JP | 01090591 A | * | 4/1989 |
| JP | 07253449 A | * | 10/1995 |
| JP | 11121666 A | * | 4/1999 |

OTHER PUBLICATIONS

International Search Report, PCT International Patent Application No. PCT/EP2006/002006, dated Feb. 22, 2007.
Written Opinion of the International Searching Authority, PCT International Patent Application No. PCT/EP2006/002006, dated Feb. 22, 2007 (English-language translation provided).
Translation of International Preliminary Report on Patentability, PCT International Patent Application No. PCT/EP2006/002006, dated Oct. 11, 2007.
European Office Action, dated Aug. 19, 2010, issued in corresponding European Patent Application No. 06707427.8.

\* cited by examiner

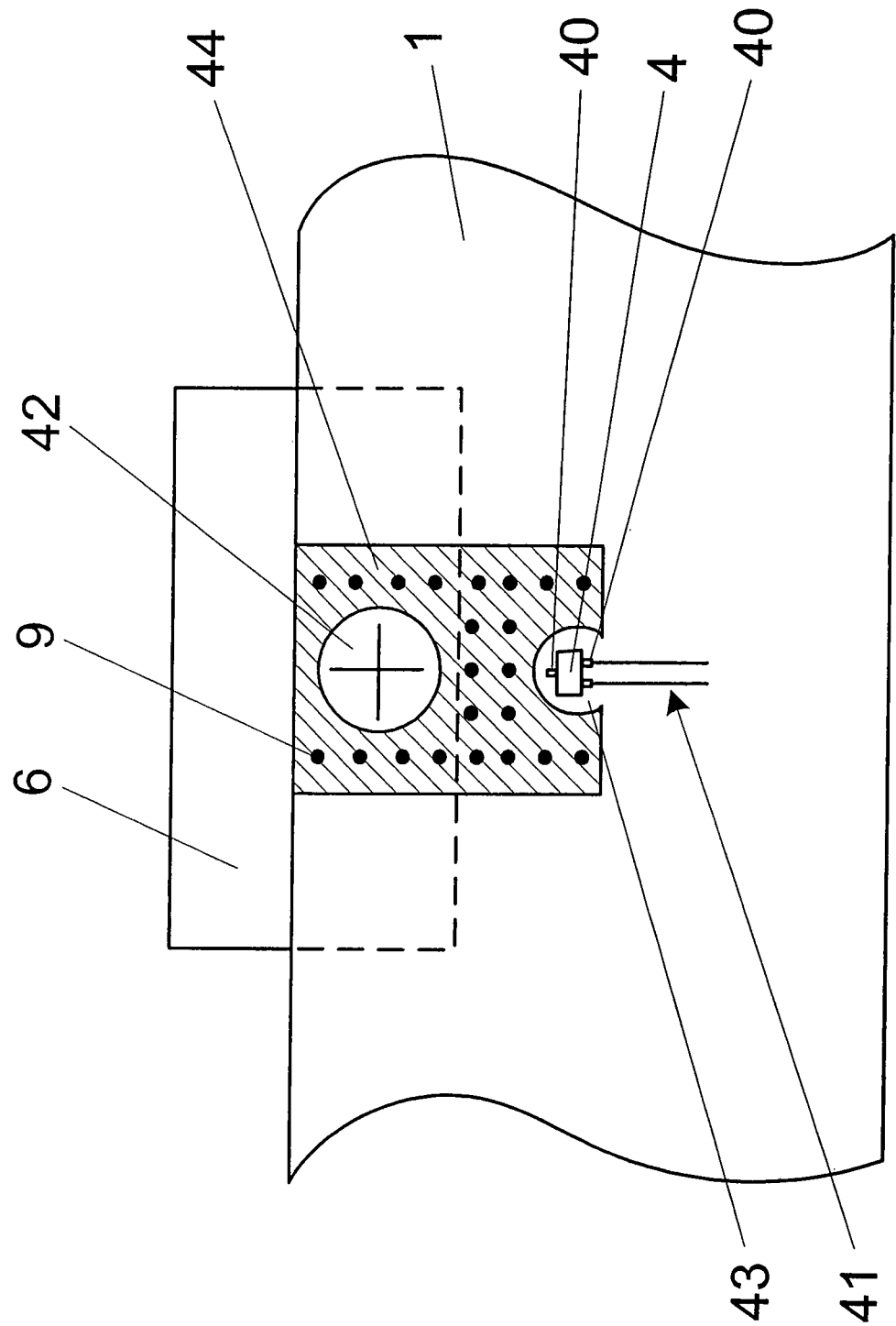

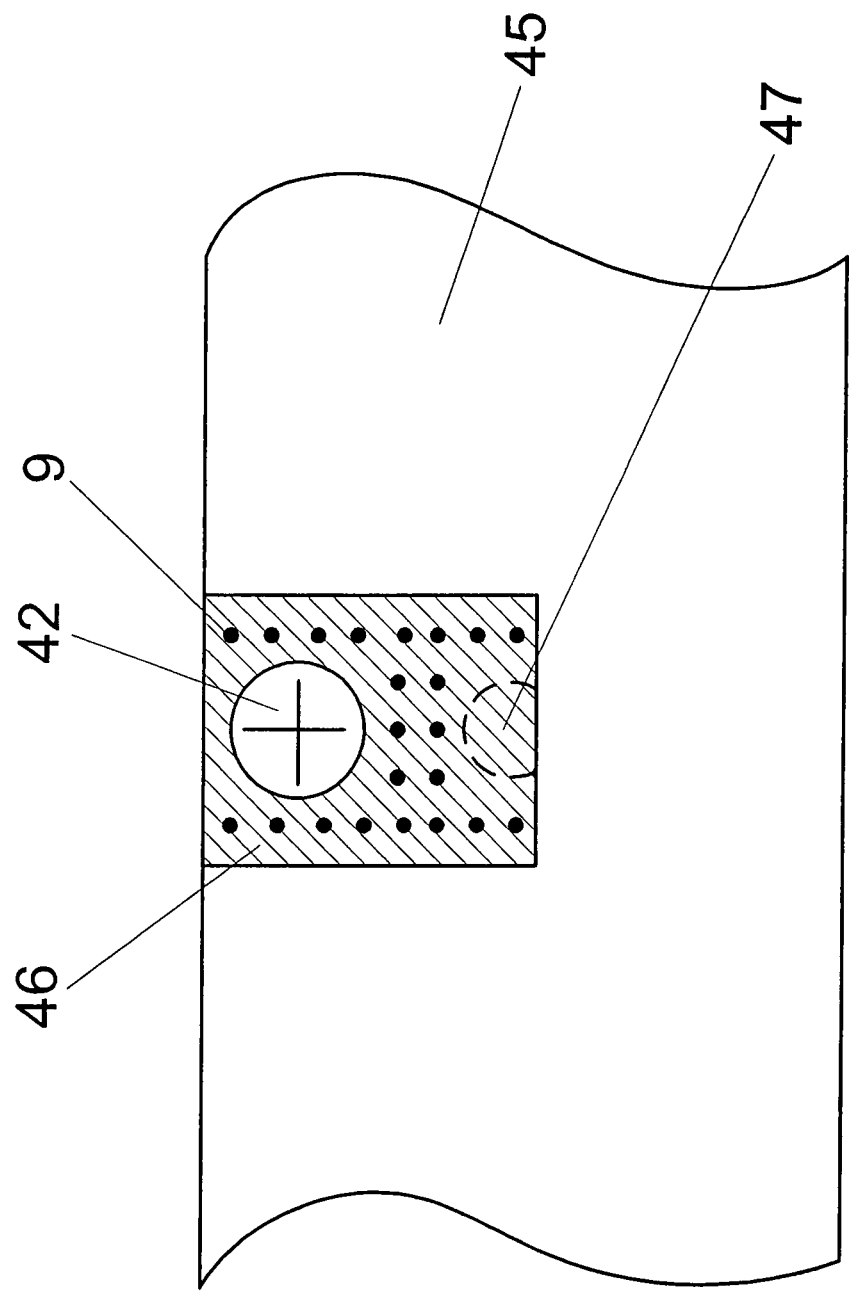

DEVICE AND METHOD FOR DETERMINING THE TEMPERATURE OF A HEAT SINK

FIELD OF THE INVENTION

The present invention relates to a device for temperature monitoring or temperature determination, for instance, and a method for determining, monitoring and/or recording the temperature of a heat sink and a heat source.

BACKGROUND INFORMATION

Such heat sources occur, for instance, in power semiconductors, coolant circulation circuits, combustion chambers and reaction chambers.

A fastening device for semiconductor switching elements is described in European Published Patent Application No. 0 654 176, in which semiconductor switching elements mounted on a printed-circuit board are pressed against a heat sink.

German Published Patent Application No. 692 09 772 describes a housing device for a functional component part, an electronic circuit being situated in a cavity, and this cavity being filled up using an electrically insulating fluid.

An electronic module is described in German Published Patent Application No. 198 07 718 in which a holding-down clamp grips a circuit substrate, and the holding-down clamp has a connecting contact in a through hole of a housing that is connected to printed-circuit traces of the circuit substrate.

German Published Patent Application No. 199 20 401 describes an apparatus and a method for temperature estimation, in which the temperature of an electronic device is provided by measuring the temperatures of two sensors.

From the internet website dated Mar. 16, 2005, of the firm Quick-Ohm Küpper & Co. GmbH, Wuppertal/Germany, heat-conducting bonding materials are described whose thermal conductivity is 7.5 W/mK and more. From the internet website dated Dec. 25, 2003, of the firm Quick-Ohm Küpper & Co. GmbH, Wuppertal/Germany, heat-conducting foils are described which are made of carbon fiber composite.

From the data sheet of the firm Philips Semiconductors, Eindhoven/The Netherlands, at row "KTY82-1" of Mar. 26, 1998, silicon temperature sensors are described which have a positive temperature coefficient of resistance and which can be used in measuring systems and control systems.

SUMMARY

Example embodiments of the present invention provide for bringing a sensor to the temperature level of a heat sink as well as possible, in an electronic device.

In the case of the electronic device, example embodiments of the present invention include a printed-circuit board equipped with a sensor and a heat sink, the sensor being connected to the heat sink in a heat-conducting manner.

The temperature of power semiconductors or other heat sources can be determined, and therefore the danger of overheating may be avoidable. Therefore, safety may be increased, in particular. Because of the improved temperature determination, the control characteristics of the electronic device may also be improved.

The printed-circuit board may be connected to the heat sink, particularly in a detachable manner. No further intermediate elements may be required.

The printed-circuit board may have a plurality of layers, in particular, it is a multi-layer printed-circuit board. Consequently, through-contacting between the printed-circuit boards of various layers is made possible. Electrical or thermal advantageous relationships are achievable in this manner.

Metallic areas of the inner layers, which are provided in spatial proximity to the sensor, may be electrically connected to at least one metallic area at the surface facing the heat sink. A thermally well-conducting connection to the heat sink may be produced, and metallic areas may have a greater thermal conductivity than the substrate material of the printed-circuit board, particularly for reaching a temperature level that is substantially the same as that of the heat sink in those areas of the inner layers that are spatially close to the sensor, especially whose distance from the points of contact of the parts of the sensor to the printed-circuit board is less than the thickness of the printed-circuit board. Thus the sensor is coupled even better to the temperature level of the heat sink.

The metallic area at the surface facing the heat sink may be connected to the heat sink electrically and/or at least in a heat-conducting manner. For example, heat-conducting paste may be used to improve the heat junctions. But even direct contact is sufficiently heat-conductive. In this manner, not only is the electrical potential adapted but also the temperature. That is, the heat of the heat sink can be conducted into the printed-circuit board, and, just as with electrical current on the printed-circuit traces, the heat may flow on the metallic printed-circuit traces, in this instance.

A fastening element may be used for the connection. This provides that a cost-effective element, such as a screw or the like can be used.

The electrical connections may include through-contacting. In particular, connecting elements of the sensor are electrically connected to the surface facing the heat sink using soldered connection, the connecting elements of the sensor being connected to printed-circuit traces of the surfaces facing away from the heat sink using through-contacting, or to the inner layers of the printed-circuit board. The sensor signals may be diverted to other printed-circuit boards on short paths which have large creeping distances to the potential of the heat sink. But the heat of the heat sink can also be transported in a simple manner in the inner layers, particularly for producing a homogeneous temperature level in the inner layers of the printed-circuit board.

The solder connections may be carried out using the SMD technique. This offers the advantage that mass production may be utilized.

The metallic areas may include copper or are made substantially of copper, as are especially the printed-circuit traces of the printed-circuit board. The advantage is that high electrical and thermal conductivity is able to be implemented by a single material.

The heat sink may be connected in a heat-conductive manner to cooling surfaces of power semiconductors, particularly either directly or indirectly, immediately or not via at least one ceramic plate or other thermally conductive materials, such as thermally conductive foil. This has the advantage that a high thermal conductivity is present for dissipating the heat of the power semiconductors at the heat sink, but that a great insulation distance between heat sink and the power semiconductors can also be implemented.

In a method for determining the temperature heat source, particularly of a power semiconductor, the heat source is connected to a heat sink in a heat-conducting manner, and the sensor is connected to the heat sink in a heat-conducting manner, the temperature of the sensor being determined,
a measure for the temperature rise within a period of time being determined, from the sum of the temperature of the sensor and the measure multiplied by a correction factor associated with the temperature rise, the temperature of the heat source being determined.

This has the advantage that the method is very easy to carry out and particularly to program, and that it requires only the slightest quantity of storage resources and computer performance.

The measure for the temperature rise may be determined within a period of time by determining the difference between the most recently measured temperature of the sensor and the one measured last before that one, the time span between the measurements of the temperature of the sensor always being the same or substantially the same. In one corresponding embodiment, the measure for the temperature rise is determined within a time span by determining the increase in the slope of the curve of the temperature of the sensor plotted against time, that is, the first derivative with respect to time. The advantage is that the manner of finding the temperature works simply and rapidly, and, in spite of that, it brings about a sufficiently good result in the case of many technical application situations.

A table of correction factors may be used instead of the correction factor, a correction factor being assigned to each increase value and/or each environmental temperature value and/or other variables, and being used correspondingly. In this context, it is advantageous that the method mentioned can be further improved.

A converter may use and/or plot the recorded temperature for controlling the supply of an electric motor.

When the temperature recorded by the sensor exceeds a specified boundary value,
   the pulse width modulation frequency and/or the power input of the converter may be reduced,
   the converter may be switched off
   and/or a warning signal may sent to the operator of the equipment.

LIST OF REFERENCE NUMERALS 1 printed-circuit board, especially multi-layer printed-circuit board
2 fastening device for the detachable connection
3 heat conducting paste
4 sensor
5 connecting point
6 heat sink
7 insulating areas
8 inner traces
9 through contacting
10 bore hole
11 substrate material
20 areas for heat-conducting stickers
40 connecting point
41 connecting traces
42 bore hole
43 insulating area
44 metallic area
45 inner layer
46 inner traces
47 subsection Example embodiments of the present invention are described in greater detail with reference to the appended Figures.

BRIEF DESCRIPTION OF THE DRAWINGS

FIG. 4a is a top view of a device according to an example embodiment of the present invention.

FIG. 4b is a top view of an inner layer of a multi-layer printed-circuit board of the device illustrated in FIG. 4a.

DETAILED DESCRIPTION

Figure 1:
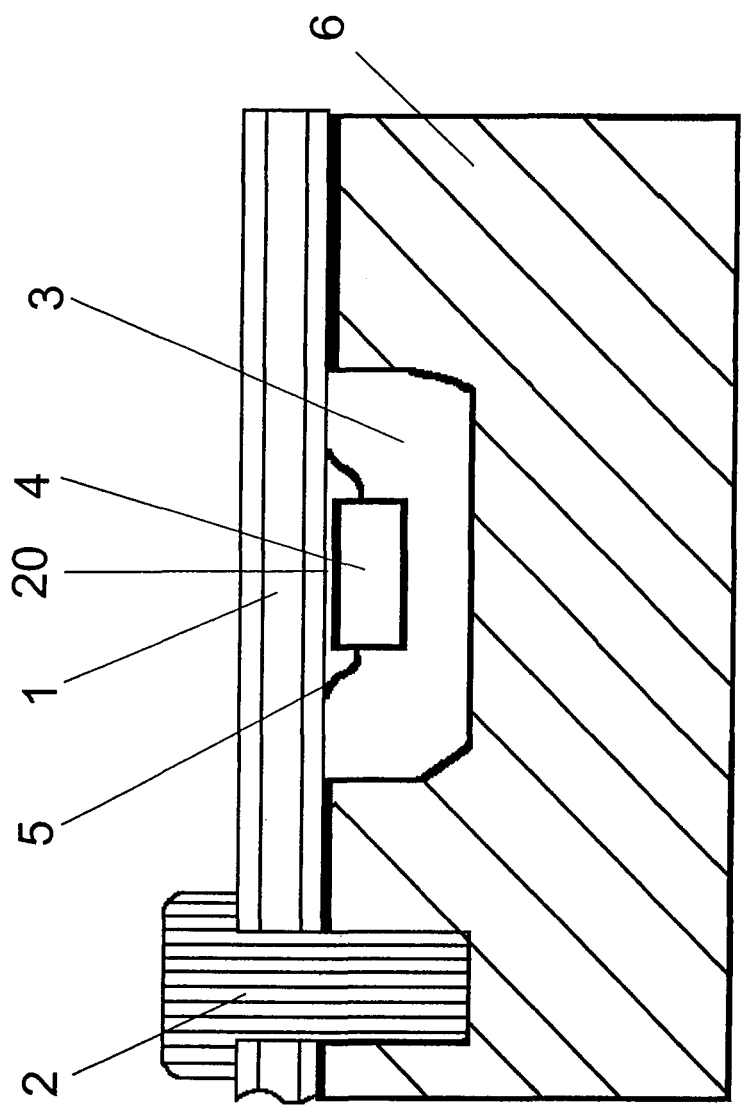
FIG. 1 is a cross-sectional view of a device according to an example embodiment of the present invention.

In the device according to example embodiments of the present invention as in FIG. 1, printed-circuit board 1 is designed as a multi-layer printed-circuit board and therefore includes several planes in which copper traces can be provided.

Printed-circuit board 1 is connected to heat sink 6 using a screw as a fastening device 2, for a detachable connection.

On the side of printed-circuit board 1 facing the heat sink a sensor 4 is soldered on at its connecting points 5. This may be performed using the SMD technique. From these soldered contacts, an electrical connection is provided in the form of through-contacting all the way through all the layers of printed-circuit board 1, for connection to printed-circuit traces on the front side of printed-circuit board 1.

Consequently, the measuring signals of the sensor are also passed on via this through-contacting to the front side of printed-circuit board 1, whereby sufficient insulation distance can be specified between signal lines and the electrically conductive heat sink.

This also makes it possible to connect printed-circuit traces in other planes, particularly inner layers of multi-layer printed-circuit board 1, electrically above the sensor, and therefore thermally as well, to copper areas on the back side of the printed-circuit board, which are able to be brought into direct contact with the heat sink. This provides that the temperature level of the heat sink is passed on to the sensor, also via the inner layers of the printed-circuit board. The sensor is surrounded, so to speak, or embedded in the temperature level of the heat sink, although the heat sink itself does not quite surround it.

Fastening device 2 in particular, which presses printed-circuit board 1, and thus also the copper areas named at the back side of printed-circuit board 1, against heat sink 6, is used for the thermal connection.

In addition, fastening device 2 is used for the mechanical connection of printed-circuit board 1 to heat sink 6.

Thus the connection is made of printed-circuit board and heat sink, using a fastening element for detachable connection of the heat sink to the printed-circuit board using a screw, for instance.

Sensor 4 is situated in a recess in heat sink 6 that is filled up with heat-conducting paste 3. The filling up may be carried out before the assembly of sensor 4.

The recess is provided and dimensioned such that required clearances and creeping distances from the sensor and its terminals are maintained.

In addition, printed-circuit board 1 is fitted with power semiconductors, such as IGBT, in regions that cannot be seen in FIG. 1, whose cooling surfaces are connected to heat sink 6 in a heat-conducting manner. For this purpose, the cooling surfaces are able to be connected directly to the heat sink or indirectly via a ceramic plate.

Sensor 4 may be arranged as a temperature sensor to monitor the temperature of the power semiconductors. Accurate control of the power semiconductors is made possible better by this temperature recording.

Chiefly, the sensor is coupled to heat sink 6 in a thermally well conducting manner, that is, having a low heat transfer resistance. The heat sink is connected, directly or indirectly, in a well heat-conducting manner, to the cooling surfaces of the power semiconductors. Sensor 4 is situated in spatial proximity to the power semiconductors. Consequently, the heat flowing via the heat sink from the power semiconductors require only short time spans. The temperature curve at the sensor follows the temperatures on the inside of the power semiconductors or the temperatures of the cooling surfaces of the power semiconductors at a delay time of a few seconds. The apparatus may be arranged so that the delay time is between one second and one minute or 3 minutes. After this delay time, within the scope of measuring accuracy, the temperature of the sensor reaches the stationary value when a constant power loss is specified at the power semiconductor.

Figure 2:
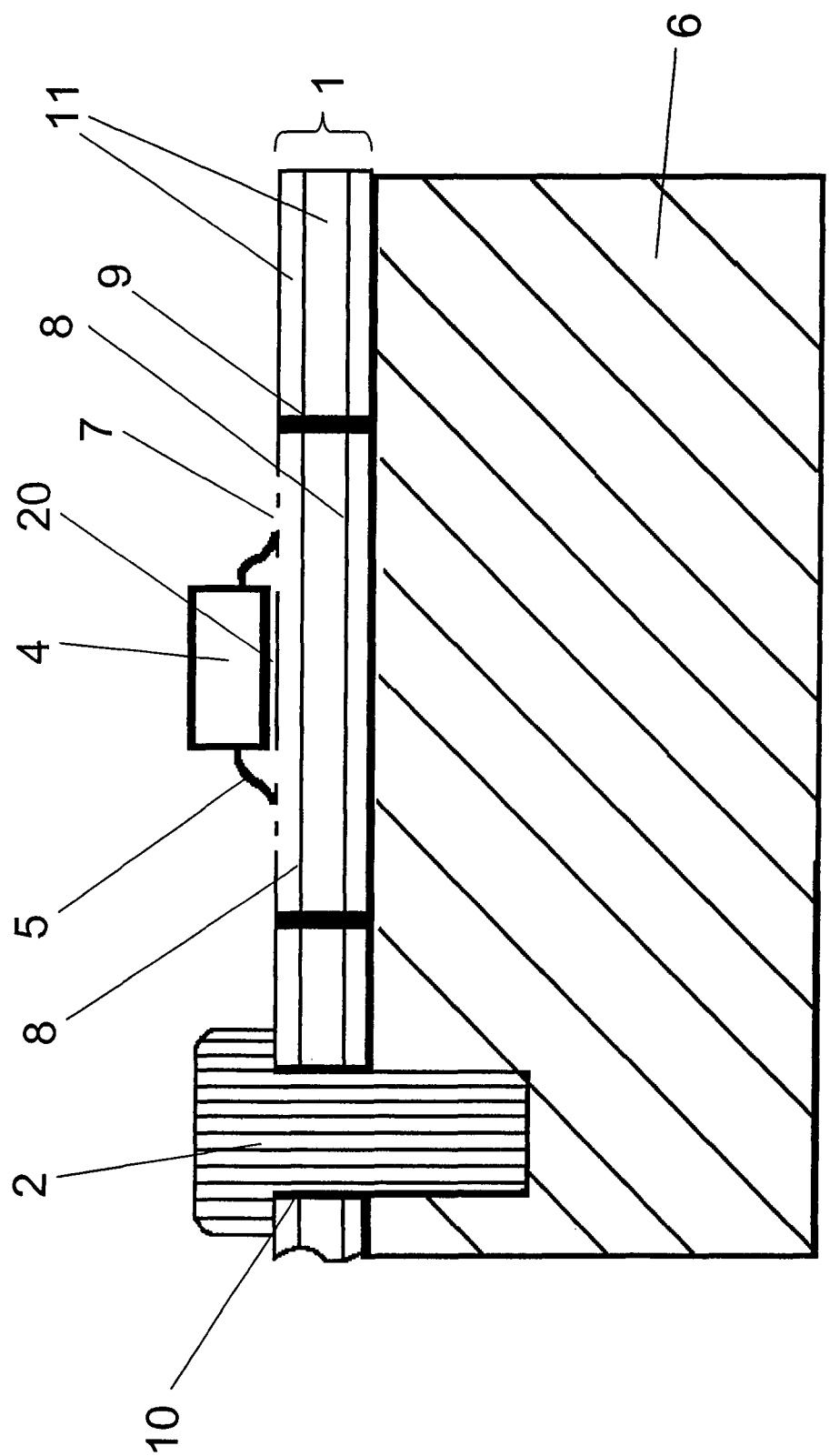
FIG. 2 is a cross-sectional view of a device according to an example embodiment of the present invention.

In the exemplary embodiment shown in FIG. 2, a printed-circuit board 1 is connected to a heat sink 6. This connection is produced via a screw 2.

A sensor 4 is attached to printed-circuit board 1 on the side facing away from heat sink 6.

As multi-layer printed-circuit board, printed-circuit board 1 includes metallic areas in inner layers, inner traces 8 which, because of their high thermal conductivity, convey the temperature of a heat sink 6 to printed-circuit board 1 and particularly to the spatial vicinity of sensor 4. In this connection, the thermal conductivity of inner traces 8 is clearly higher than that of substrate material 11 of the multi-layer printed-circuit board. The use of metallic materials, such as copper or copper alloys, for the inner traces, as well as of plastics, such as epoxy resin, for the substrate of the multi-layer printed-circuit board may be provided.

By spatial proximity of the sensor one is to understand, in this case, the set of all spatial points whose spatial distance from sensor 4, including its connecting terminals 5 or connecting devices are of lesser thickness than the thickness of printed-circuit board 1.

To effect the thermal connection, at least screw 2 is also used between heat sink 6 and inner traces 8. This provides that bore 10 is lined with an electrical conductor for screw 2, in the manner of a through-contacting, whereby the thermal connection of inner traces 8 to screw 2, and thus to heat sink 6, is improved. It may also be provided that, on the side of the printed-circuit board facing the head of the screw, metallic surfaces are situated which produce a good thermal contact with the inner traces of the printed-circuit board.

In order to effect the thermal connection between heat sink 6 and inner traces 8, in addition, in the areas of printed-circuit board 1 which touch heat sink 6, metallic areas are provided at the surface of the printed-circuit board which are connected to inner traces 8 at least via metallically lined bore 10, electrically and in a heat-conducting manner. A very high heat transfer coefficient is achieved thereby for the heat transfer between heat sink 6 and inner traces 8.

The high thermal conductivity of inner traces 8 has the effect that the mediated temperature in the vicinity of sensor 4 is substantially equal to the temperature of heat sink 6. Because of the small heat capacity of inner traces 8, the temperature also follows the changes of the temperature of the heat sink.

How accurate the equality of these two temperatures is depends on the exact physical properties of the thermal connection of inner traces 8 to heat sink 6, and their exact heat capacities. Thus, the geometrical execution of the inner layers and the mechanical connection of the printed-circuit board to the heat sink is selected, in this instance, such that the respective heat capacity and the heat transfer resistance from heat sink 6 to sensor 4 are low.

The heat conduction to temperature sensor 4 occurs at least via connecting points 5 and the lines connected to them, in this instance.

Inner traces 8, that are shown schematically in FIG. 2, include two layers of printed-circuit traces. This has the advantage that the thermal connection is improved.

Inner traces 8 of printed-circuit board 1 are connected to through-contactings 9. Consequently, different inner traces 8 are connected electrically and thermally among one another and/or to metallic surfaces of printed-circuit board 1, whereby inner traces 8 are able to mediate the temperature of heat sink 6 in the vicinity of sensor 4 in an improved manner. In particular, a homogeneous temperature distribution may be attainable.

On the surface of printed-circuit board 1 facing sensor 4, structures are provided that include insulating areas 7 and electrical printed-circuit traces, by which sensor 4 is connected electrically via connecting points 5 to an evaluation unit. These printed-circuit traces are positioned, in this instance, such that a sufficient electrical insulating separation distance, particularly according to Standard EN 61800-5-1, is maintained to those metallic areas which have the electrical potential of the heat sink. This may provide that sensor 4 can be operated at an electrical potential that is different from that of the heat sink. Because of this, the sensor can particularly be integrated into a circuit, without costly galvanic decoupling devices.

Figure 3:
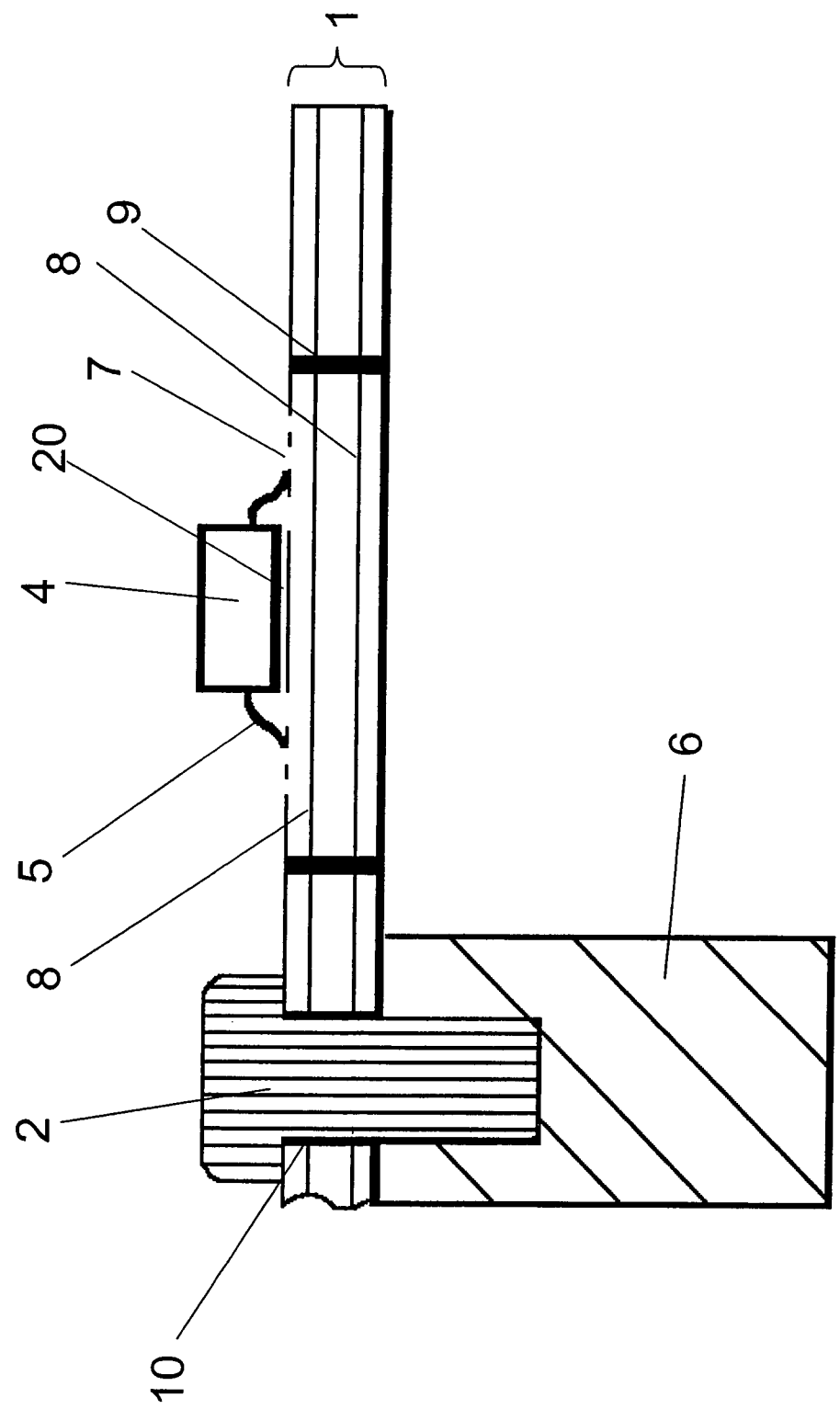
FIG. 3 is a cross-sectional view of a device according to an example embodiment of the present invention.

In the exemplary embodiment shown in FIG. 3, the contact surface of heat sink 6 on printed-circuit board 1 does not extend to those areas which are opposite to sensor 4 on the side facing away from it. Sensor 4 is therefore mounted in a region of the printed-circuit board whose spatial distance from the contact surface of heat sink and printed-circuit board amounts to a multiple of the length of sensor 4 that exceeds one. This may provide that sensor 4 is flexible and placeable, and still, a very good thermal connection is possible of sensor 4 to the temperature level of the heat sink, particularly via inner traces 8. Depending on requirements on quality of the thermal connection, the distance of the sensor from the contact surface of heat sink and printed-circuit board is able clearly to exceed tenfold the length of the sensor.

Example embodiments of the present invention also include executions in which sensor 4 is situated at a spatial distance from heat sink 6 but on the same side of printed-circuit board 1 as heat sink 6.

In the exemplary embodiment shown in FIG. 4a, a multi-layer printed-circuit board 1 is shown on which a sensor 4 is mounted. This sensor 4 is connected to printed-circuit board 1 via connecting points 40. Sensor 4 is connected to an evaluation unit, via connecting traces 41 on printed-circuit board 1.

A silicon temperature sensor of the series "KTY82-1" of the firm Philips Semiconductors may be used as the sensor.

A heat sink 6 is connected to printed-circuit board 1 via a screw, which passes through a bore 42. At its surface facing away from the heat sink, printed-circuit board 1 has a metallic area 44, which is connected to the head of the screw electrically, and therefore in a heat-conducting manner too.

An insulating region 43 is developed about sensor 4 which effects an electrical separation of sensor 4 from the electrical potential of the heat sink. In particular, the geometrical embodiment of insulating region 43 is executed according to Standard EN 61800-5-1 and the potential difference between sensor 4 and heat sink 6.

Through-contactings 9 produce an electrical, and thus also a heat-conducting connection of metallic area 42 to metallic regions of the inner layers, that is, the inner traces of printed-circuit board 1.

FIG. 4b shows such an inner layer 45 in a top view. Inner traces 46 are provided on it, which are connected via through-contactings 9 to the metallic areas 44 on the surface. These inner traces 46 also extend particularly to partial areas 47 which, in the direction of view of the top view, are situated below sensor 4. This has the effect of providing a very good thermal connection of sensor 4 to heat sink 6, and at the same time having secure electrical insulation from potential differences.

Because of the plurality of through-contactings 9 used and the inner traces, a very good thermal connection of sensor 4 to the heat sink is achieved.

If, for example, insulating region 43 creates a distance of metallic region 44 of approximately 3 mm from connecting points 40 of the sensor, and if inner traces 46 of the multi-layer printed-circuit board are at a distance of about 200 μm from the surface of the printed-circuit board, electrical potential differences of about 300 V may be reached between sensor 4 and heat sink 6, there being quite a good thermal connection between sensor 4 and heat sink 6.

The heat sink may have recesses which enclose parts of the printed-circuit board connected to the sensor. This may provide that the heat sink partially takes over a housing-forming function for the printed-circuit board, and that heat transfer resistance between printed-circuit board and heat sink is particularly low.

Sensor 4 may be connected via connecting points (5, 40) to printed-circuit board 1 using SMD technology.

Sensor 4 may be arranged as a semiconductor sensor or a platinum resistance sensor of type pt100 or pt1000, for instance.

The heat sink may be connected to at least one power semiconductor in a very well heat-conducting manner. This may provide that a measure for the temperature of the power semiconductor is determinable, using the sensor.

The heat source may be connected to cooling surfaces of power semiconductors, either indirectly or directly, via at least one ceramic plate in a heat-conducting manner. An advantage of this is that, on the one hand, the heat sink is electrically insulated from the power semiconductors and, on the other hand, the heat transfer between power semiconductor and heat sink has a high heat transfer coefficient.

Instead of using screws 2 to connect printed-circuit board and heat sink, other detachable or non-detachable connections may be used. For this purpose, continuous material connections, such as adhesive connections, soldered connections or welded connections and/or connections using rivets, clamping and/or latching connections may be provided.

Sensor 4 may be connected to printed-circuit board 1 at least by continuous material, especially the connection including an adhesive connection, especially the adhesive connection between the printed-circuit board and the sensor having a lower heat transfer resistance than a connection of the sensor to the printed-circuit board via connecting points of the sensor. Consequently, the sensor is fixed in the printed-circuit board using a heat-conducting adhesive. This adhesive is applied particularly in those areas which respectively correspond to the areas designated as 20 in FIGS. 1 to 3. The adhesive has a thermal conductivity of 7.5 W/mK or more.

In particular, the heat-conducting adhesive Quick Cool of the firm Quick-Ohm Küpper & Co. GmbH, Wuppertal, Germany, may be used. It may be provided that the thermal connection of sensor 4 to inner traces 8 is improved, and that the material stress, caused by thermal processes, of the soldered connection of the connecting points of the sensor on the printed-circuit board is reduced.

In additional exemplary embodiments, the electronic unit is a television set, a frequency converter, a rectifier inverter, a power converter, a lighting console, a phase-angle control, switch mode power parts, a d.c. chopper controller, or generally a unit having semiconductor relays or thyristors.

Instead of the electrical device, a device may be provided that has a heat source that is connected to a housing part, such as a heat sink. This heat sink is connected to a multi-layer printed-circuit board. The heat source may be monitored thereby in a simple and robust manner.

The heat source may be a part of the housing of an internal combustion engine, or may be connected to it in a very well heat-conducting manner. This may provide that the temperature of an internal combustion engine is able to be simply monitored.

The heat sink may be a component part of a heating system. This may provide that the temperature of radiators and/or combustion chambers of the heating system are able to be determined and monitored.

The heat sink may be a component part of chemical equipment for carrying out chemical reaction processes. An advantage is that the temperature of vessels of the chemical plant, and thus the temperature of the substances participating in the chemical reaction, is able to be determined and monitored, using sensor 4.

The heat sink may be a component part of a cooling circulation, for instance, in a power plant. This may provide that one can form a decentralized monitoring circuit in a robust, cost-effective manner that is easy to maintain.

The determined temperature of the sensor may be able to be used for ascertaining the temperature of the power semiconductor and/or the heat sink in the following manner:

The power semiconductors may be operated pulse-width modulated, particularly in the case of an electronic unit such as converters, etc.

The power loss of the power semiconductors is determined from the electrical measured variables, such as the current and the voltage, as well as from parameters which specify the pulse-width modulation. As the current, one might particularly provide the motor current of the electric motor supplied by the converter. As the voltage, one might provide, for instance, the intermediate circuit voltage of the converter. As the parameters, one might name, for instance, the pulse-width modulation ratio. If in addition the heat transfer resistances between the power semiconductor and sensor, as well as between heat sink and sensor have been determined, one may determine the temperature of the power semiconductor and/or the heat sink from the measured sensor temperature, as long as the power loss is held constant. In this context, one should observe the delay time.

In the method, the slope of the sensor's temperature curve plotted against time is determined. The model value for the temperature of the power semiconductor is then formed as the sum of the temperature-measured by the sensor and the slope value multiplied by a correction factor. The correction factor, in this instance, is determined once only in the laboratory and is then able to be stored as a parameter in the converter. In this manner, an extremely simple method is found for the temperature determination of the power semiconductor. The method works particularly well in applications in which the power loss is constant as long as possible, but at least as long as the delay time. For instance, a conveyor belt is switched on and driven at a first speed by the electric motor, another speed being set only after 10 or 100 minutes. The temperature determination is also sufficiently good in the case of a hoisting gear which goes up for 5 minutes, pauses for 3 minutes and then goes down again for 3 minutes.

However, the higher the heat capacities of the components of the electronic device are, the less accurately the temperature determination works. Therefore, one may select the heat capacities and also the distances between the components to be as small as possible, as long as other properties of the device are not impaired thereby.

Instead of using a single correction factor, a correction factor associated with each slope may be stored and used.

Instead of using a single correction factor, a correction factor associated with each slope and with each environmental temperature may be stored and used for the temperature determination.

In the last two cases mentioned, higher accuracies are achievable.

Instead of the slope, one or more higher derivatives with respect to time of the curve of the temperature measured by the sensor plotted against time may be determined and used, correction factors being assigned in each case, and being stored in the memory of the device, for instance, a converter.

What is claimed is:

1. A device, comprising:
   a printed-circuit board;
   a sensor; and
   a heat sink;
   wherein the sensor is connected to the heat sink in a heat-conducting manner;
   wherein the printed-circuit board is directly connected to the heat sink at a metallic area at a surface of the printed-circuit board facing the heat sink at least one of (a) electrically and (b) in a heat-conducting manner;
   wherein the printed-circuit board is a multi-layer printed-circuit board;
   wherein metallic areas of inner layers of the printed-circuit board are electrically and thermally connected to at least one metallic area at the surface of the printed-circuit board facing the heat sink; and
   wherein the metallic areas are printed-circuit traces of the printed-circuit board.

2. The device according to claim 1, wherein the connection of the printed-circuit board and the heat sink includes a fastening device detachably connecting the heat sink to the printed-circuit board.

3. The device according to claim 2, wherein the fastening device includes using a screw.

4. The device according to claim 1, wherein metallic regions of the printed-circuit board have a higher thermal conductivity than a substrate material of the printed-circuit board substrate material to attain a temperature level which is substantially the same as a temperature of the heat sink, of areas of the inner layers which are spatially close to the sensor having distances from points of contact of parts of the sensor to the printed-circuit board less than a thickness of the printed-circuit board.

5. The device according to claim 1, wherein the electrical connections include through-contactings to produce a homogeneous temperature level in the inner layers of the printed-circuit board.

6. The device according to claim 1, wherein the sensor includes connecting elements electrically connected by soldered connections on a surface facing the heat sink, the connecting elements of the sensor being connected to at least one of (a) printed-circuit traces of surfaces facing away from the heat sink and (b) inner traces of the printed-circuit board.

7. The device according to claim 6, wherein the soldered connections are formed using an SMD technique.

8. The device according to claim 1, wherein the device comprising at least one of (a) the sensor is mounted on a side of the printed-circuit board facing away from the heat sink, (b) the sensor is mounted on the side of the printed-circuit board facing the heat sink and (c) the heat sink includes recesses which enclose parts of the printed-circuit board connected to the sensor.

9. The device according to claim 1, wherein the sensor is mounted in a region of the printed-circuit board having a spatial distance from a contact surface of the heat sink and the printed-circuit board that amounts to a multiple of a length of the sensor that exceeds one.

10. A device, comprising:
    a printed-circuit board;
    a sensor having a connection to the printed-circuit board via connecting points; and
    a heat sink;
    wherein the sensor is connected to the heat sink in a heat-conducting manner;
    wherein the printed-circuit board is connected to the heat sink;
    wherein the printed-circuit board is a multi-layer printed-circuit board;
    wherein metallic areas of inner layers of the printed-circuit board are electrically and thermally connected to at least one metallic area at a surface of the printed-circuit board facing the heat sink; and
    wherein the printed-circuit board and the sensor are connected at least by a continuous material including an adhesive connection, the adhesive connection between the printed-circuit board and the sensor having a lower heat transfer resistance than the connection of the sensor to the printed-circuit board via the connecting points of the sensor.

11. The device according to claim 1, wherein the metallic areas include copper or are made of copper.

12. The device according to claim 1, wherein at least one of (a) the heat sink is connected to cooling surfaces of power semiconductors in a heat-conducting manner and (b) the heat sink is connected in a heat-conducting manner to cooling surfaces of power semiconductors, one of (1) indirectly and (2) directly, via at least one of (i) a ceramic plate and (ii) a heat-conducting foil.

13. The device according to claim 1, wherein the heat sink is at least one of (a) a part of a housing of an internal combustion engine, (b) a component part of a heating system, (c) a component part of a chemical plant for carrying out chemical reaction processes and (d) a component part of a coolant circulation circuit.

14. The device according to claim 1, wherein the device is arranged as at least one of (a) an electronic unit, (b) an inverter, (c) a cycloconverter, (d) a voltage-source converter and (e) a converter for supplying an electric motor.

15. A method for determining a temperature of a heat source connected to a heat sink in a heat-conducting manner, a sensor being connected to the heat sink in a heat-conducting manner, a multi-layer printed-circuit board being equipped with the sensor, comprising:
    determining a temperature of the sensor;
    determining a measure for a temperature rise within a period of time;
    determining a correction factor associated with the temperature rise, the correction factor being based on at least one of (a) a slope value of a curve of the temperature of the sensor plotted against time, and (b) an environmental temperature value; and determining the temperature of the heat source from a sum of the temperature of the sensor and the measure for the temperature rise multiplied by the correction factor associated with the temperature rise.

16. The method according to claim 15, wherein the heat source includes a power semiconductor.

17. The method according to claim 15, wherein the measure for the temperature rise within a time span is determined by determining a difference of a most recently measured temperature of the sensor and the temperature of the sensor measured last prior to that, the time span between the measurements of the temperature of the sensor always being the same.

18. The method according to claim 15, wherein the measure for the temperature rise is determined within a time span by determining the slope value of the curve of the temperature of the sensor plotted against time.

19. The method according to claim 15, wherein the correction factor is included in a table of correction factors, each of the correction factors assigned to at least one of (a) each slope value, and (b) each environmental temperature value.

20. The method according to claim 15, further comprising at least one of:
   (a) using the determined temperature for control in a supply of an electric motor; and
   (b) plotting by a converter the determined temperature for control in the supply of the electric motor.

21. The method according to claim 20, wherein, when the temperature determined by the sensor exceeds a specified boundary value, at least one of (a) at least one of (i) a pulse width modulation frequency and (ii) a power input of the converter is reduced, (b) the converter is switched off and (c) a warning signal is sent to an operator.

* * * * *